(12) United States Patent
Sejima

(10) Patent No.: US 10,901,039 B2
(45) Date of Patent: Jan. 26, 2021

(54) OPEN CIRCUIT VOLTAGE ESTIMATION DEVICE, CONDITION ESTIMATION DEVICE, AND METHOD OF ESTIMATING OPEN CIRCUIT VOLTAGE

(71) Applicant: GS Yuasa International Ltd., Kyoto (JP)

(72) Inventor: Kenichi Sejima, Kyoto (JP)

(73) Assignee: GS YUASA INTERNATIONAL LTD., Kyoto (JP)

( * ) Notice: Subject to any disclaimer, the term of this patent is extended or adjusted under 35 U.S.C. 154(b) by 1326 days.

(21) Appl. No.: 13/897,115

(22) Filed: May 17, 2013

(65) Prior Publication Data

US 2013/0311118 A1 Nov. 21, 2013

(30) Foreign Application Priority Data

May 17, 2012 (JP) .................................. 2012-113271

(51) Int. Cl.
*G01R 31/382* (2019.01)
*G01R 31/3835* (2019.01)
*G01R 31/367* (2019.01)

(52) U.S. Cl.
CPC ....... *G01R 31/382* (2019.01); *G01R 31/3835* (2019.01); *G01R 31/367* (2019.01)

(58) Field of Classification Search
CPC .................................................. G01R 31/382
See application file for complete search history.

(56) References Cited

U.S. PATENT DOCUMENTS 4,344,142 A * 8/1982 Diehr, II ............. B29C 35/0288
264/325
4,514,694 A * 4/1985 Finger .................... G01R 31/36
324/429

(Continued)

FOREIGN PATENT DOCUMENTS

JP H04-134279 A 5/1992
JP 07-98367 A 4/1995

(Continued)

OTHER PUBLICATIONS

Supreme Court Decision (*Alice* vs *CLS bank*) (2013).*
Extended European Search Report dated Jun. 24, 2015.

*Primary Examiner* — Hyun D Park
(74) *Attorney, Agent, or Firm* — McGinn I.P. Law Group, PLLC.

(57) ABSTRACT

An open circuit voltage estimation device for estimating an open circuit voltage of an electric storage device includes a voltage measurement portion and a controller. The voltage measurement portion measures terminal voltages of the electric storage device. The controller is configured to: control the voltage measurement portion to measure the terminal voltages; store the terminal voltages in association with elapsed time since charge or discharge completion time; calculate a variation in terminal voltage per unit time at predetermined elapsed time since the charge or the discharge of the electric storage device is complete based on the terminal voltages measured by the voltage measurement portion; and estimate the open circuit voltage based on the predetermined elapsed time, the voltage at the predetermined elapsed time, and the variation.

18 Claims, 5 Drawing Sheets

(56) References Cited

U.S. PATENT DOCUMENTS

| | | | | |
|---|---|---|---|---|
| 5,682,305 | A | * 10/1997 | Kurokami | G05F 1/67 |
| | | | | 323/299 |
| 6,313,605 | B1 | * 11/2001 | Tsenter | H02J 7/0073 |
| | | | | 320/125 |
| 7,684,941 | B2 | 3/2010 | Sao et al. | |
| 2002/0145430 | A1 | * 10/2002 | Arai | B60K 6/22 |
| | | | | 324/426 |
| 2008/0065336 | A1 | 3/2008 | Seo et al. | |
| 2009/0115419 | A1 | * 5/2009 | Ueda | G01R 31/3624 |
| | | | | 324/430 |
| 2009/0256524 | A1 | 10/2009 | Nukui | |
| 2010/0085009 | A1 | 4/2010 | Kang et al. | |

FOREIGN PATENT DOCUMENTS

| | | | |
|---|---|---|---|
| JP | 2002-250757 | A | 9/2002 |
| JP | 2003-346919 | A | 12/2003 |
| JP | 2008-64740 | A | 3/2008 |
| JP | 2009-204314 | A | 9/2009 |
| JP | 2009-234557 | A | 10/2009 |
| JP | 2010-200574 | A | 9/2010 |
| JP | 2010-203854 | A | 9/2010 |

* cited by examiner

OPEN CIRCUIT VOLTAGE ESTIMATION DEVICE, CONDITION ESTIMATION DEVICE, AND METHOD OF ESTIMATING OPEN CIRCUIT VOLTAGE

CROSS-REFERENCE TO RELATED APPLICATIONS

This application claims priority from Japanese Patent Application No. 2012-113271 filed on May 17, 2012.

FIELD

The present invention relates to a technology for estimating an open circuit voltage (OCV) of an electric storage device.

BACKGROUND

Conventionally, electronic storage devices that can be rechargeable, such as secondary batteries, have been used. The flied in which the electric storage devices are used has been broadened in these days.

Conventionally, a technology for estimating an internal condition of an electric storage device has been known (e.g. Patent Document 1). The technology uses a correlation between open circuit voltage and internal condition of the electric storage device for estimating the internal condition of the electric storage device. The technology includes measuring an open circuit voltage of the electric storage device and estimating an internal condition of the electric storage device based on a predefined correlation between open circuit voltage and internal condition of the electric storage device.

Patent Document 1: JP-A-2009-204314

An open circuit voltage of an electric storage device is a terminal voltage of the electric storage device that is in a stable state after the charge/discharge thereof is complete. Therefore, a certain period is required after the charge/discharge of the electric storage device is complete to measure the open circuit voltage thereof using the known technology. Namely, the open circuit voltage of the electric storage device cannot be measured until the terminal voltage of the electric storage device becomes stable, which results in a problem that an internal condition of the electric storage device cannot be estimated at an early stage.

SUMMARY

The following presents a simplified summary of the invention disclosed herein in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

An objective of the present invention is to provide a technology for estimating an open circuit voltage of an electric storage device at an early stage.

An open circuit voltage estimation device for estimating an open circuit voltage of an electric storage device according to an aspect of the present invention includes a voltage measurement portion and a controller. The voltage measurement portion is configured to measure terminal voltages of the electric storage device. The controller is configured to: control the voltage measurement portion to measure the terminal voltages of the electric storage device after charge or discharge of the electric storage device is complete; store the terminal voltages in association with elapsed time since charge or discharge completion time at which charge or discharge of the electric storage device is complete; calculate a variation in terminal voltage per unit time at predetermined elapsed time since the charge or the discharge of the electric storage device is complete based on the terminal voltages measured by the voltage measurement portion; and estimate the open circuit voltage based on the predetermined elapsed time, the voltage at the predetermined elapsed time, and the variation.

BRIEF DESCRIPTION OF DRAWINGS

The foregoing and other features of the present invention will become apparent from the following description and drawings of an illustrative embodiment of the invention in which.

DESCRIPTION OF EMBODIMENTS

Figure 1:
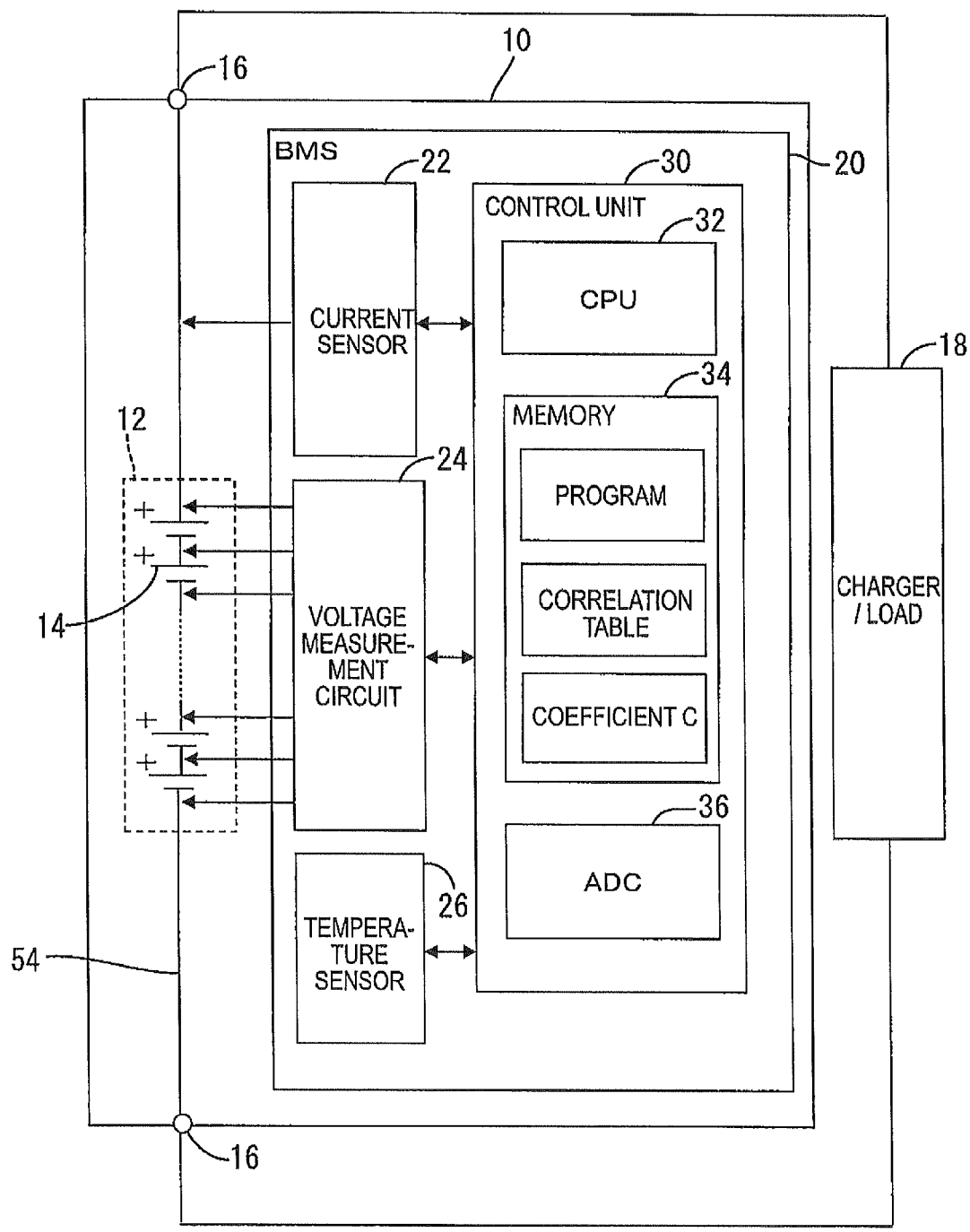
FIG. 1 is a schematic view illustrating a configuration of a battery system.
Figure 2:
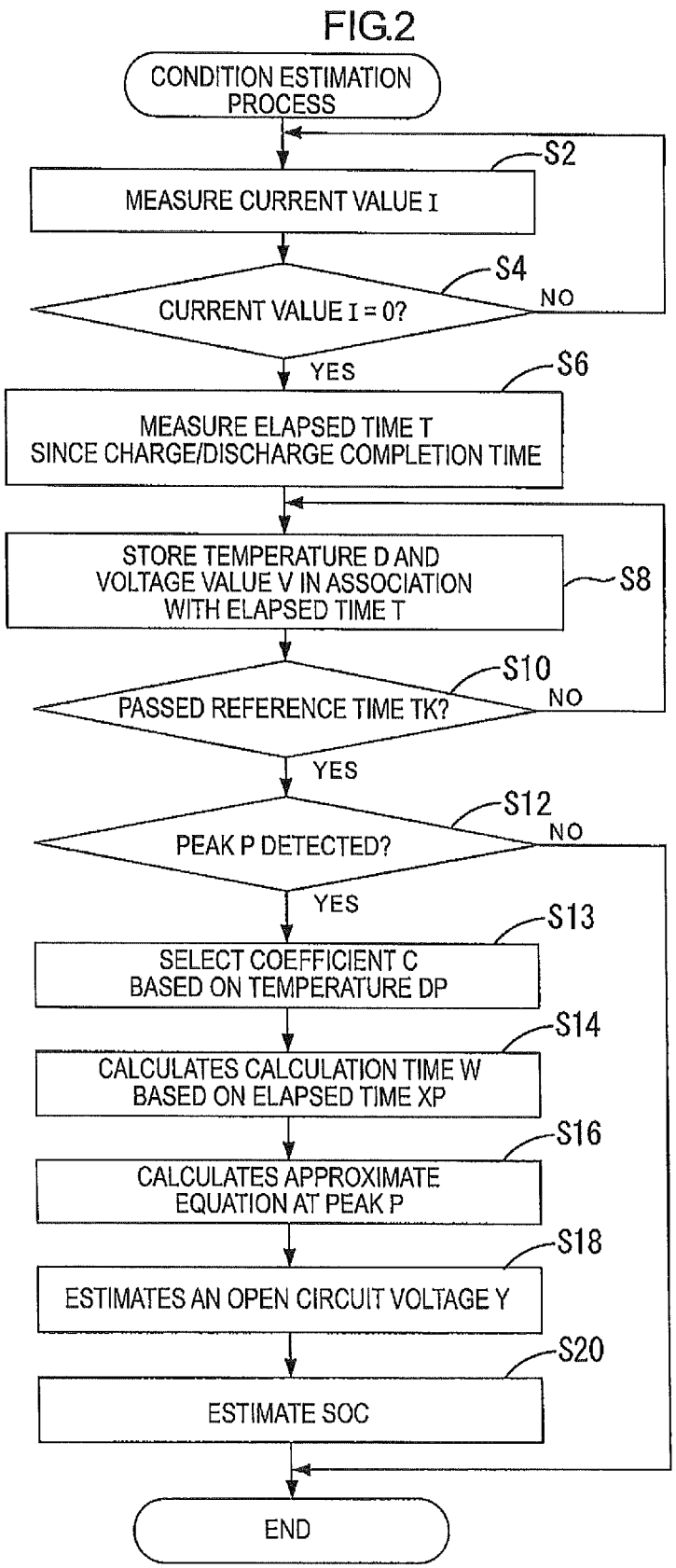
FIG. 2 is a flowchart illustrating a condition estimation process.

An open circuit voltage estimation device for estimating an open circuit voltage of an electric storage device according to an aspect of the present invention includes a voltage measurement portion and a controller. The voltage measurement portion is configured to measure terminal voltages of the electric storage device. The controller is configured to: control the voltage measurement portion to measure the terminal voltages of the electric storage device after charge or discharge of the electric storage device is complete; store the terminal voltages in association with elapsed time since charge or discharge completion time at which charge or discharge of the electric storage device is complete; calculate an approximate equation of an approximate line of the terminal voltages, the approximate line at a predetermined elapsed time since the charge or the discharge of the electric storage device is complete; calculate calculation time based on the predetermined elapsed time and a coefficient defined according to an active material of the electric storage device and the predetermined elapsed time; and define a value calculated by substituting the calculation time in the approximate equation as an estimated open circuit voltage.

Generally in an electric storage device, it takes relatively long time after charge or discharge of the electric storage device is complete until the terminal voltage changes to the open circuit voltage. If the charge is performed and the terminal voltage is higher than the open circuit voltage, the terminal voltage decreases and then converges to an open circuit voltage. If the discharge is performed and the terminal voltage is lower than the open circuit voltage, the terminal voltage increases and then converges to an open circuit voltage.

An inventor conducted researches in technology for estimating an open circuit voltage based on a terminal voltage measured in a period between when charge or discharge was completed and when the terminal voltage converged to an open circuit voltage. From the researches, the inventor found that a gradient of an approximate equation of an approximate line of terminal voltages at a predetermined elapsed time in the period is proportional to a difference between the terminal voltage and the open circuit voltage at the predetermined elapsed time. The inventor also found that a constant of proportion is defined according to an active material of the electric storage device and the predetermined elapsed time regardless of internal conditions of the electric storage device.

In the open circuit voltage estimation device according to the scope of the claimed invention, the estimated open circuit voltage is defined based on the approximate equation of the approximate line of the terminal voltages at the predetermined elapsed time and the coefficient defined according to the active material of the electric storage device and the predetermined elapsed time. Therefore, if the approximate equation and the coefficient at the predetermined elapsed time can be obtained, the measurement of terminal voltages for the period between when charge or discharge is completed and when the terminal voltage converges to an open circuit voltage is not required. Therefore, the open circuit voltage can be estimated at an earlier stage.

In the open circuit voltage estimation device, the controller is further configured to use a common logarithm of the elapsed time for calculating the approximate equation. According to the open circuit voltage estimation device, the approximate equation of the approximate line of the terminal voltages can be easily calculated by using the common logarithm of the elapsed time even though the terminal voltages gradually change for a relatively long period.

In the open circuit voltage estimation device, the controller is further configured to: detect a peak at which a gradient of the terminal voltages is the largest; and use elapsed time from when the charge or the discharge of the electric storage device is complete to when the terminal voltage reaches the peak as the predetermined elapsed time.

In the electric storage device, a peak may be present in a period between when charge or discharge is completed and when the terminal voltage converges to an open circuit voltage. For example, if the terminal voltage is higher than the open circuit voltage because the electric storage device is charged, the following first and second regions may exist in this sequence. In the first region, the terminal voltage starts decreasing and an absolute value of time variation in terminal voltage increases. In the second region, the absolute value of time variation in terminal voltage starts decreasing and the terminal voltage converges to the open circuit voltage. If the terminal voltage is lower than the open circuit voltage because the electric storage device is discharged, the following first and second regions may exist in this sequence. In the first region, the terminal voltage starts increasing and an absolute value of gradient increases. In the second region, the absolute value of gradient starts decreasing and the terminal voltage converges to the open circuit voltage. Namely, in the electric storage device, the terminal voltage may pass the peak at which the absolute value of gradient of the terminal voltages is the largest during the transition from the first region to the second region after the charge or the discharge is complete.

In this open circuit voltage estimation device, the open circuit voltage at the peak is estimated. Namely, the open circuit voltage is estimated using at least the approximate equation at the peak of the terminal voltage, that is, in a specific condition of the electric storage device. Therefore, the open circuit voltage can be accurately estimated.

The open circuit voltage estimation device further includes a temperature measurement circuit configured to measure a temperature of the electric storage device. In the open circuit voltage estimation device, the coefficient is defined based on a temperature of the electric storage device. In the open circuit voltage estimation device, the controller is further configured to determine the coefficient based on the temperature of the electric storage device at the predetermined elapsed time for calculating the calculation time. According to the open circuit voltage estimation device, the open circuit voltage can be accurately estimated by defining the coefficient according to the temperature of the electric storage device at the predetermined elapsed time.

In the open circuit voltage estimation device, the controller is further configured to control the voltage measurement portion to terminate the measurement of terminal voltages when the elapsed time has passed a predefined reference time. According to the open circuit voltage estimation device, the measurement of terminal voltages is terminated if the elapsed time has passed a predefined reference time. Namely, it is not necessary to continue the measurement of terminal voltages until an open circuit voltage is measured.

The open circuit voltage estimation device further includes a current detection circuit configured to detect at least one of charge and discharge currents of the electric storage device. In the open circuit voltage estimation device, the controller is further configured to detect the charge or discharge completion time according to a detection result of the current detection circuit for controlling the voltage measurement portion. According to the open circuit voltage estimation device, the charge or discharge completion time can be properly detected using the current detection circuit.

According to another aspect of the present invention, there is provided a condition estimation device including the open circuit voltage estimation device described above and a memory that is configured to store information on correlation between open circuit voltage and internal condition of the electric storage device. The controller is further configured to estimate an internal condition of the electric storage device based on the estimated open circuit voltage and the information on the correlation stored in the memory. According to the open circuit voltage estimation device, the internal condition of the electric storage device can be estimated at an earlier stage using the open circuit voltage estimated at an earlier stage.

According to another aspect of the present invention, there is provided a method of estimating an internal condition of an electric storage device. The method comprising: measuring terminal voltages of the electric storage device after charge or discharge of the electric storage device is complete; storing the terminal voltages in association with elapsed time since charge or discharge completion time at which charge or discharge of the electric storage device is complete; calculating an approximate equation of an approximate line of the terminal voltages, the approximate line at a predetermined elapsed time since the charge or the discharge of the electric storage device is complete; calculating calculation time based on the predetermined elapsed time and a coefficient defined according to an active material of the electric storage device and the predetermined elapsed time; and defining a value calculated by substituting the calculation time in the approximate equation as an estimated open circuit voltage.

In the above method, the calculating an approximate equation includes using a common logarithm of the elapsed time for calculating the approximate equation.

The above method further includes detecting a peak at which a gradient of the terminal voltages is the largest. In the method, the calculating an approximate equation includes using elapsed time from when the charge or the discharge of the electric storage device is complete to when the terminal voltage reaches the peak as the predetermined elapsed time.

In the above method, the coefficient is defined based on a temperature of the electric storage device, and the calculating calculation time includes determining the coefficient based on the temperature of the electric storage device at the predetermined elapsed time for calculating the calculation time.

In the above method, the measuring terminal voltages includes terminating the measurement of terminal voltages when the elapsed time has passed a predefined reference time.

In the above method, the measuring terminal voltages includes detecting the charge or discharge completion time according to a detection result of detection for detecting charge or discharge current of the electric storage device.

According to the present invention, an open circuit voltage of an electric storage device can be estimated at an earlier stage.

An embodiment will be described with reference to FIGS. 1 to 5.

1. Configurations of Condition Estimation System

A battery system 10 illustrated in FIG. 1 according to this embodiment is a power supply system installed in an electric vehicle or a hybrid vehicle, for example, for supplying power to electric-powered devices.

As illustrated in FIG. 1, the battery system 10 includes an assembled battery 12 and a battery management system (hereinafter referred to as the BMS) 20. The assembled battery 12 includes a plurality of cells 14 connected in series. Each cell 14 is a rechargeable secondary battery, more specifically, a lithium ion battery, a voltage across which measures about 4V when fully charged. The assembled battery 12 is connected to charger/load 18 via connection terminals 16. The charger 18 may be arranged inside or outside the electric vehicle or the hybrid vehicle. The load 18 may be an electric-powered device arranged inside the electric vehicle or the hybrid vehicle. The BMS 20 controls charge and discharge of the assembled battery 12. The EMS 20 estimates an open circuit voltage Y and a state of charge (an example of an internal condition, hereinafter referred to as the SOC) of each cell 14. Each cell 14 is an example of an electric storage device. The BMS 20 is an example of an open circuit voltage estimation system and an example of a condition estimation system.

As illustrated in FIG. 1, the BMS 20 includes a control unit 30, a current sensor 22, a voltage measurement circuit 24, and a temperature sensor 26. The control unit 30 includes a central processing unit (hereinafter referred to as the CPU) 32, a memory 34 such as a ROM or a RAM, and an analog-to-digital converter (hereinafter referred to as the ADC) 36. The memory 34 stores various programs for controlling operations of the BMS 20 (including a battery management program). The CPU 32 controls components of the battery system 10 according to the programs read out of the memory 34. For example, the CPU 32 executes a condition estimation process, which will be described later. The memory stores information on active material of each cell 14 and coefficients C. The memory 34 also stores a correlation table containing correlation data between open circuit voltage Y and SOC of each cell 14 (see FIG. 5). The control unit 30 is an example of a controller. The current sensor 22 is an example of a current detection circuit. The voltage measurement circuit 24 is an example of a voltage measurement circuit. The temperature sensor 26 is an example of a temperature measurement circuit.

The current sensor 22 detects a current value I of a charge current or a discharge current (hereinafter referred to as the charge/discharge current) per predetermined period. The charge/discharge current flows through the assembled battery 12 via the wiring 54 that connects the connection terminals 16 and the assembled battery 12. The current sensor sends an analog detection signal corresponding to the detected current value I (A) to the ADC 36.

The voltage measurement circuit 24 is connected across each cell 14 in the assembled battery 12. The voltage measurement circuit 24 detects a voltage value V (V) across the cell 14 per predetermined period and sends an analog detection signal corresponding to the detected voltage value V to the ADC 36. The voltage value V across each cell 14 is an example of a terminal voltage.

The temperature sensor 26 is a contact or non-contact temperature sensor configured to measure a temperature D (° C.) of each cell 14 in the assembled battery 12 per predetermined period and sends an analog detection signal corresponding to the detected temperature D to the ADC 36.

The ADC 36 converts the analog signals sent from the current sensor 22, the voltage measurement circuit 24, and the temperature sensor 26 to digital signals, respectively. The ADC 36 writes digital data indicating the current value I, the voltage value V, and the temperature D on the memory 34.

The battery system 10 also includes an operating portion (not illustrated) and a display portion (not illustrated) including a liquid crystal display configured to display information including degree of degradation of the assembled battery 12.

2. Condition Estimation Process

The condition estimation process performed by the BMS 20 after charge/discharge of the assembled battery 12 is complete will be described with reference to FIGS. 2 through 5. In the condition estimation process executed by the CPU 32 of the EMS 20 in FIG. 2, the open circuit voltage Y of the target cell 14 is estimated based on the voltage value V of the cell 14 and an SOC of the cell 14 is estimated based on the estimated open circuit voltage Y. Estimation of SOCs of the cells 14 is performed in sequence for each single cell 14 in the assembled battery 12.

When the battery system 10 is activated and charge/discharge of the assembled battery 12 is started as the electric vehicle is turned on or charge of the electric vehicle is started by a user, the BMS 20 is activated and the CPU 32 starts the condition estimation process. Specifically, the CPU 32 reads the program out of the memory 34 and executes the condition estimation process illustrated in FIG. 2. After the CPU 32 starts the condition estimation process, the CPU 32 starts measuring the temperature D and the voltage value V of the cell 14 and starts measuring the current value I (S2).

The CPU 32 determines whether the charge/discharge of the assembled battery 12 is complete based on the current value I (S4). If the electric vehicle is stopped or charge of the electric vehicle is complete, the current value I becomes zero. If the current value I is zero (YES in step S4), the CPU determines that the charge/discharge of the assembled battery 12 is complete. The condition that "the current value I is zero" is not limited to a condition that the current I is completely zero. The condition that "the current value I is zero" includes a condition that the current value I is substantially zero, that is, lower than a predetermined current value at completion of charge/discharge. If the current value I is not zero (NO in step S4), the CPU 32 returns to step S2.

If the completion of the charge/discharge of the assembled battery 12 is determined, the CPU 32 measures elapsed time T since time at which the current value I becomes zero (hereinafter referred to as a charge/discharge completion time) (S6). Furthermore, the CPU 32 continues the measurement of the temperature D and the voltage value V of the cell 14 after the charge/discharge completion time and stores the measured temperature D and the voltage value V in the memory 34 in association with the elapsed time T (S8). The CPU 32 continues the measurement of the temperature T and the voltage value V until the elapsed time T reaches a reference time KT (while the result of determination in step S10 is NO). The reference time KT is set based on an active material and an SOC of the cell 14.

When the elapsed time T reaches the reference time KT (YES in step S10), the CPU 32 terminates the measurement of the temperature D and the voltage value V of the cell 14 and executes a peak detection step (S12). The CPU 32 calculates an elapsed time X, which is expressed in common logarithm of the elapsed time T. Then, the CPU 32 executes a step for detecting a peak P (Tp(Xp), Vp) at which an absolute value of a gradient of the measured voltage values V is the largest. The value Tp (Xp) corresponds to an elapsed time T (X) until the voltage value V reaches the peak P and the value Vp corresponds to a voltage value V at the peak P.

$$X = \log_{10} T$$

Figure 3:
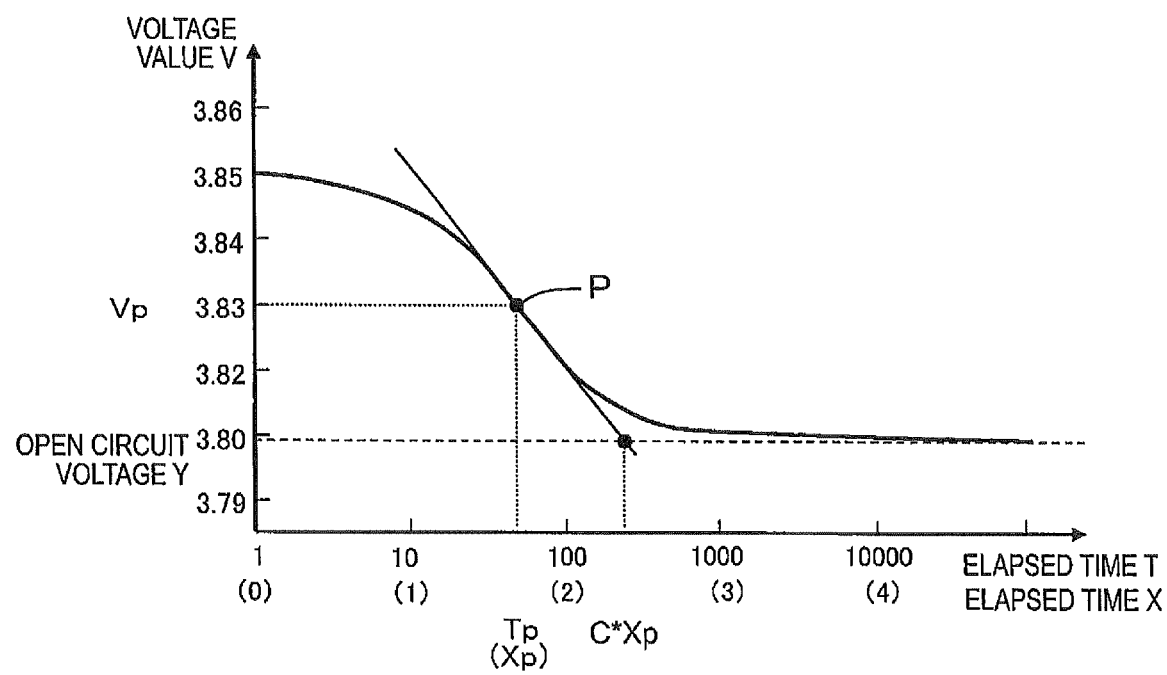
FIG. 3 is a graph illustrating variations in voltage value of a cell after charge thereof is complete.

Variations in voltage value V after the charge is complete are illustrated in FIG. 3. FIG. 3 illustrates variations in voltage value V after the cell 14 is charged from 10% SOC to 30% SOC. The horizontal axis and the vertical axis of FIG. 3 are the common logarithm of the elapsed time T (i.e., the elapsed time X) and the voltage value V, respectively. As illustrated in FIG. 3, the voltage value V is higher than the open circuit voltage Y at the time of the completion of charge. The voltage value V starts decreasing and the gradient having a negative value gradually decreases after the completion of charge. When the elapsed time T becomes Tp and the voltage value V reaches the peak P at which the gradient is the smallest, the absolute value of the gradient becomes the largest. After passing the peak P, the gradient of the voltage value V starts increasing and the voltage value V converges to the open circuit voltage Y.

Figure 4:
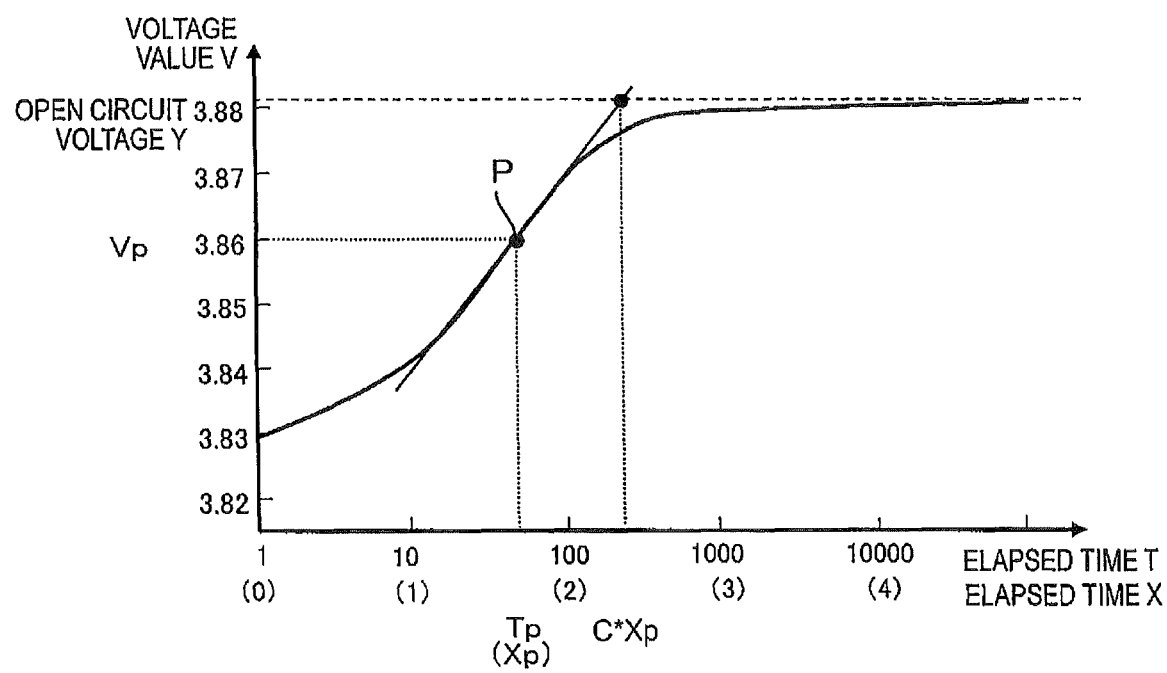
FIG. 4 is a graph illustrating variations in voltage value of a cell after discharge thereof is complete.
Figure 5:
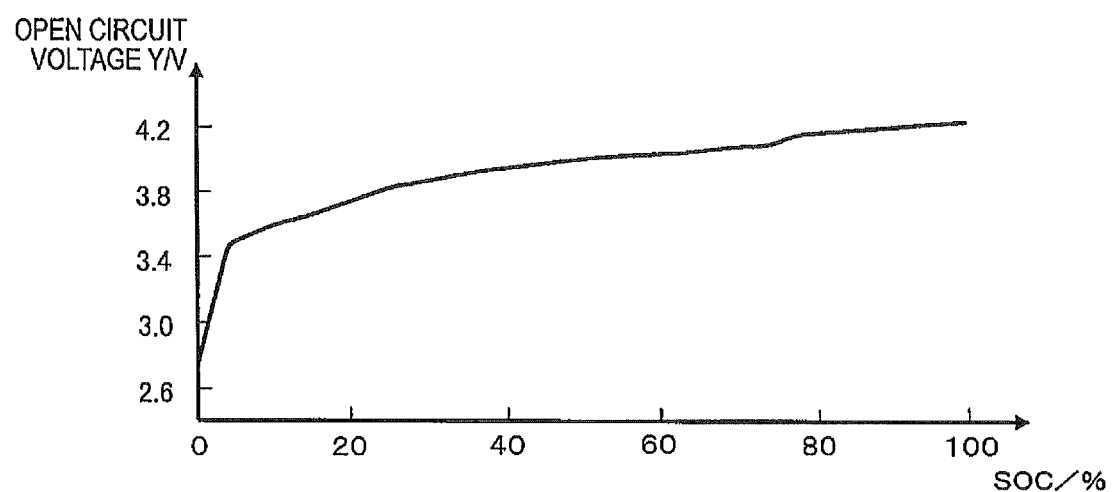
FIG. 5 is a graph illustrating correlation between open circuit voltage of the cell and SOC.

Variations in voltage value V after the discharge is complete are illustrated in FIG. 4. FIG. 4 illustrates variations in voltage value V after the cell 14 is discharged from 70% SOC to 50% SOC. The horizontal axis and the vertical axis of FIG. 4 are the common logarithm of the elapsed time T (i.e., the elapsed time X) and the voltage value V, respectively. As illustrated in FIG. 4, the voltage value V is lower than the open circuit voltage Y at the time of the completion of discharge. The voltage value V starts increasing and the gradient having a positive value gradually increases after the completion of discharge. When the elapsed time T becomes Tp and the voltage value V reaches the peak P at which the gradient is the largest, the absolute value of the gradient becomes the largest. After passing the peak P, the gradient of the voltage value V starts decreasing and the voltage value V converges to the open circuit voltage Y.

Namely, as illustrated in FIGS. 3 and 4, the voltage values V after the completion of charge and discharge reach the peaks P at which the absolute values of gradients are the largest before reaching the open circuit voltages Y. After passing the peaks P, the voltage values V converge to the open circuit voltages Y.

The CPU 32 calculates the gradient of the voltage values V measured every predetermined period based on the elapsed time X and determines whether the voltage value V has reached the peak P based on the absolute value of the gradient. If the absolute value of the gradient of the voltage values V measured until the reference time KT continues increasing, the CPU 32 determines that the peak P does not exist (NO in step S12) and terminates the condition estimation process. The voltage values V may be measured every predetermined period or continuously.

If the absolute value of the gradient of the voltage values V measured until the reference time KT decreases at some point, the CPU 32 determines that the peak P exists (YES in step S12). Then, the CPU 32 detects the peak at which the absolute value of the gradient of the voltage values V is the maximum and detects a temperature Dp at the peak P.

Then, the CPU 32 reads a coefficient C of the cell 14 out of the memory 34 and calculates a calculation time W. The coefficient C is a constant defined in association with a kind of the active material of the cell 14. The coefficient C is stored in the memory 34 as a coefficient of each cell 14 at the peak. Furthermore, the coefficient C is a constant defined according to the temperature D of the cell 14 and stored in the memory 34 in association with the temperature D of the cell 14. For a lithium ion battery including a metal oxide containing lithium as a positive active material and a carbon material as a negative active material, a coefficient C is 1.48 (no unit) if a temperature D is 25° C. and the coefficient C is 1.38 (no unit) if the temperature D is 0° C.

The CPU 32 selects the coefficient C stored in the memory 34 in association with the temperature Dp at the peak P (S13) and calculates the calculation time W by multiplying the elapsed time Xp, which is the elapsed time X at the peak P, by the coefficient C (S14).

$$W = C * Xp$$

Then, the CPU 32 calculates an approximate equation of an approximate line at the peak P (S16). A method for calculating the approximate equation including the following steps may be used. Ina graph with elapsed time X on the abscissa (x-axis) and voltage value V on the ordinate (y-axis), two points immediately before and after the peak P are selected. The point immediately before the peak P should be a point that indicates the voltage value V measured immediately before time that is the x coordinate of the peak P. The other point should be a point that indicates the voltage value V measured immediately after the time. A line is drawn by connecting these two points. The line is defined as an approximate line at the peak P. Then, an approximate equation of the approximate line is calculated. Alternatively, an approximate equation may be calculated using the above two points and a known method, such as a method of least squares, and defined as an approximate equation at the peak P. The approximate equation is expressed as follows:

$$V = A * X + B$$

Where A is a gradient and B is an intercept.

Then, the CPU 32 estimates an open circuit voltage Y (S18). The CPU 32 substitutes the calculation time W for the voltage value X of the approximate equation and defines the voltage value V obtained through the above calculation as an estimated open circuit voltage Y (see FIGS. 3 and 4).

Then, the CPU 32 estimates an SOC of the cell 14 based on the estimated open circuit voltage Y (S20). The CPU reads a correlation table containing correlation data between open circuit voltage Y and SOC of the cell 14 illustrated in FIG. 5 out of the memory 34. The CPU 32 determines an SOC associated with the estimated open circuit voltage Y in the correlation table as an estimated SOC of the cell 14.

The coefficient C stored in the memory 34 is defined using a single cell 14, or using another cell 14 containing the same active material, and stored in the memory 34. The coefficient C may be defined using the above equation at any reference time, such as a time at which the cell 14 is put in use, based on a temperature D and a voltage value V measured after the completion of charge/discharge, a peak P (Tp, Vp) of the measurement, a temperature Dp at the peak P, an approximate equation of an approximate line at the peak P, and an open circuit voltage Y, all obtained in advance.

3. Effects (1) In the battery system 10 according to this embodiment, the open circuit voltage Y is estimated based on the approximate equation of the approximate line at the peak P and the coefficient C defined based on the active material of the cell 14. If the peak P and the approximate equation at the peak P are obtained, it is not necessary to continue the measurement of the voltage value V until the voltage value V converges to the open circuit voltage Y after passing the peak P. Therefore, the open circuit voltage Y can be estimated at an earlier stage. Conventionally, if an accuracy of about 3% at 25° C. is required, it is necessary to continue the measurement of the voltage value V for about 40 minutes. In contract, if the accuracy of about 3% is required, a period required for the measurement of the voltage value V can be reduced equal to or shorter than 100 seconds in the battery system according to this embodiment.

A period during the estimation of the open circuit voltage Y is a disabled period in which the charge/discharge of the cell 14 cannot be performed. If the disabled period is relatively long, use efficiency of the cell 14 decreases. In the battery system according to this embodiment, a disabled period during the estimation of the open circuit voltage Y (or the SOC) is shortened. Therefore, use efficiency of the cell 14 can be improved.

(2) In the battery system 10 according to this embodiment, the open circuit voltage Y is estimated using the coefficient C defined based on the active material of the cell 14. The coefficient C is a constant defined in association with the kind of the active material of the cell 14. Therefore, if the kind of the active material of the cell 14 is known, it is not necessary to obtain the coefficient C for every charge/discharge and thus the open circuit voltage Y can be estimated at an earlier stage.

(3) In the battery system 10 according to this embodiment, the coefficient C is selected bated on the temperature Dp measured by the temperature sensor 26 at the peak P. Then, the open circuit voltage Y is estimated using the selected coefficient. Therefore, the open circuit voltage Y can be accurately estimated.

(4) In the battery system 10 according to this embodiment, the measurement of the temperature D and the voltage value V is terminated after the measurement of the temperature D and the voltage value V is performed for a reference time TK. In comparison to a configuration in which measurement of voltage value V is performed until the voltage value V converges to an open circuit voltage Y, the open circuit voltage Y can be estimated at an earlier stage.

(5) In the battery system 10 according to this embodiment, the charge/discharge completion time is detected based on time when the current value I detected by the current sensor 22 becomes zero. Therefore, the charge/discharge completion time can be accurately detected.

(6) In the battery system 10 according to this embodiment, the SOC of the cell 14 is estimated using the approximate equation of the approximate line at the peak P and the open circuit voltage Y estimated at the earlier stage using the coefficient C defined based on the active material of the cell 14. Therefore, the SOC of the cell 14 can be estimated at an earlier stage.

Other Embodiments

The present invention is not limited to the embodiments described above and illustrated in the drawings. The following various embodiments are also included in the technical scope of the present invention.

(1) In the above embodiment, the cells 14 of the secondary battery are provided as an example of an electric storage device. However, the electric storage device is not limited to the cells 14 and may be a capacitor in which an electrochemical phenomenon occurs.

(2) In the above embodiment, the open circuit voltage Y is estimated based on the approximate equation of the approximate line at the peak P and the coefficient C at the peak P. However, the time for obtaining the approximate line after the completion of charge/discharge of the assembled battery 12 is not limited to the peak P. The open circuit voltage Y may be estimated based on an approximate equation of the approximate line obtained at any time before the voltage value V converges to the open circuit voltage Y.

In this case, the coefficient C may be stored in association with the elapsed time T(X) since the charge/discharge completion time in addition to the active material of the cell 14 and the temperature D. After the approximate equation of the approximate line is calculated, the CPU 32 selects the coefficient C stored in the memory 34 in association with the elapsed time T related to the approximate line and calculates the calculation time W. Then, the CPU 32 estimates the open circuit voltage Y based on the approximate equation and the calculation time W.

(3) In the above embodiment, as illustrated in FIGS. 3 and 4, to define the approximate line of the voltage value V, the approximate line is defined using the elapsed time X expressed in common logarithm of the elapsed time T and the approximate equation of the approximate line is obtained. However, to define the approximate line, the elapsed time T may be used without converting to the elapse time X or may be a value expressed in natural logarithm of the elapsed time T may be used.

(4) In the above embodiment, the SOC is estimated using the correlation table containing correlation data between open circuit voltage Y and SOC for estimating the SOC of the cell 14 based on the estimated open circuit voltage Y of the cell 14. However, a method for estimating an SOC is not limited to the above method. A known method for estimating an SOC based on an open circuit voltage Y can be used.

(5) In the above embodiment, the time at which the current value I of the assembled battery 12 measured by the current sensor 22 of the BMS 20 becomes zero is detected as charge/discharge completion time. However, a method for detecting charge/discharge completion time is not limited to the above method. For example, the charge discharge completion time may be detected based on system status information input by a management system that manages the battery system 10.

(6) In the above embodiment, the coefficient C is selected based on the temperature Dp at the peak P. However, the coefficient C may not be selected based on the temperature Dp at the peak P. Furthermore, the temperature D used for selecting the coefficient C is not limited to the temperature Dp at the peak P. The coefficient C may be selected based on the temperature D of the cell 14 measured between the completion of charge/discharge and the time Xp at which the peak P is measured.

(7) In the above embodiment, the control unit 30 including a single CPU 32 is provided as an example of a controller. However, a controller including a plurality of CPUs, a controller including a hardware circuit such as an application specific integrated circuit (ASIC), and a controller including both CPU(s) and ASIC(s) may be used. Namely, the controller can have any configuration as long as the condition estimation process can be executed through software or a hardware circuit.

(8) Some of the steps in the condition estimation process may not be required. For example, the controller may terminate the condition estimation process without executing the SOC estimation step after the estimation of an open circuit voltage (S18) is executed.

(9) In the above embodiment, the program that is read and executed by the CPU 32 is stored in the memory 34. However, the program may be stored in a non-volatile memory such as a hard disk device and a flash memory or on a storage medium such as a CD-R. The memory 34 may not be provided in the control unit 30 and may be provided outside the control unit 30.

What is claimed is:

1. An open circuit voltage estimation device for estimating an open circuit voltage of an electric storage device, the open circuit voltage estimation device comprising:
    a voltage measurement portion configured to measure terminal voltages of the electric storage device; and
    a controller configured to:
        control the voltage measurement portion to measure the terminal voltages of the electric storage device after a charge or a discharge of the electric storage device is complete;
        store the terminal voltages in association with an elapsed time since a charge or a discharge completion time at which the charge or the discharge of the electric storage device is complete;
        in a single curve that demonstrates variations in the terminal voltages of the electric storage device after the charge or the discharge of the electric storage device is complete, detect a peak at which a gradient of the terminal voltages is largest;
        use the elapsed time from when the charge or the discharge of the electric storage device is complete to when the terminal voltages reach the peak as a predetermined elapsed time; and
        estimate the open circuit Voltage by using an approximate equation of an approximate line of the terminal voltages, the approximate line being at the predetermined elapsed time and being based on the largest gradient and the measured terminal voltages at the predetermined elapsed time,
    wherein the estimate of the open circuit voltage is used to estimate a state of charge of the electric storage device.

2. The open circuit voltage estimation device according to claim 1, wherein the controller is further configured to:
    estimate the open circuit voltage:
        by calculating a calculation time based on the predetermined elapsed time and a coefficient defined according to an active material of the electric storage device and the predetermined elapsed time; and
        by substituting the calculation time for a voltage value of the approximate equation and defining another voltage value obtained through the calculating as an estimated open circuit voltage.

3. The open circuit voltage estimation device according to claim 2, wherein the controller is further configured to use a common logarithm of the predetermined elapsed time for calculating the approximate equation.

4. The open circuit voltage estimation device according to claim 2, further comprising a temperature measurement portion configured to measure a temperature of the electric storage device,
    wherein the coefficient is defined based on the temperature of the electric storage device, and
    wherein the controller is further configured to determine the coefficient based on the temperature of the electric storage device at the predetermined elapsed time for calculating the calculation time.

5. The open circuit voltage estimation device according to claim 2, wherein the controller is further configured to control the voltage measurement portion to terminate the measurement of terminal voltages when the elapsed time has passed a predefined reference time.

6. The open circuit voltage estimation device according to claim 2, further comprising a current detection portion configured to detect at least one of a charge and a discharge currents of the electric storage device,
    wherein the controller is further configured to detect the charge or the discharge completion time according to a detection result of the current detection portion for controlling the voltage measurement portion.

7. A condition estimation device, comprising:
    the open circuit voltage estimation device according to claim 1; and
    a memory configured to store information on a correlation between open circuit voltage and an internal condition of the electric storage device,
    wherein the controller is further configured to estimate the internal condition of the electric storage device based on the information on the correlation stored in the memory.

8. The open circuit voltage estimation device according to claim 1, wherein, at the peak, an absolute value of the gradient of the measured voltage values is the largest.

9. The open circuit voltage estimation device according to claim 1, wherein the controller is further configured to use the predetermined elapsed time for calculating the approximate equation.

10. The open circuit voltage estimation device according to claim 1, wherein the controller is further configured to estimate the open circuit voltage by calculating a calculation time based on the predetermined elapsed time and a coefficient defined according to an active material of the electric storage device and the predetermined elapsed time.

11. The open circuit voltage estimation device according to claim 10, further comprising a temperature measurement portion configured to measure a temperature of the electric storage device,
    wherein the coefficient is defined based on the temperature of the electric storage device.

12. The open circuit voltage estimation device according to claim 11, wherein the controller is further configured to determine the coefficient based on the temperature of the electric storage device at the predetermined elapsed time for calculating the calculation time.

13. A method of estimating an internal condition of an electric storage device, the method comprising:
    measuring terminal voltages of the electric storage device after a charge or a discharge of the electric storage device is complete;

storing the terminal voltages in association with an elapsed time since a charge or a discharge completion time at which the charge or the discharge of the electric storage device is complete;

in a single curve that demonstrates variations in the terminal voltages of the electric storage device after the charge or the discharge of the electric storage device is complete, detecting a peak at which a gradient of the terminal voltages is largest;

using the elapsed time from when the charge or the discharge of the electric storage device is complete to when the terminal voltages reach the peak as a predetermined elapsed time;

estimating the open circuit voltage by using an approximate equation of an approximate line of the terminal voltages, the approximate line being at the predetermined elapsed time and being based on the largest gradient and the measured terminal voltage at the predetermined elapsed time; and estimating a state of charge of the electric storage device by using the estimating of the open circuit voltage.

14. The method according to claim 13, wherein the estimating the open circuit voltage includes:

calculating a calculation time based on the predetermined elapsed time and a coefficient defined according to an active material of the electric storage device and the predetermined elapsed time; and substituting the calculation time for a voltage value of the approximate equation and defining another voltage value obtained through the calculating the calculation time as an estimated open circuit voltage.

15. The method according to claim 14, wherein the coefficient is defined based on a temperature of the electric storage device, and wherein the calculating calculation time includes determining the coefficient based on the temperature of the electric storage device at the predetermined elapsed time for calculating the calculation time.

16. The method according to claim 14, wherein the measuring terminal voltages includes terminating the measurement of terminal voltages when the elapsed time has passed a predefined reference time.

17. The method according to claim 14, wherein the measuring terminal voltages includes detecting the charge or discharge completion time according to a detection result of detection for detecting a charge or a discharge current of the electric storage device.

18. The method according to claim 13, wherein the calculating the approximate equation includes using a common logarithm of the elapsed time for calculating the approximate equation.

* * * * *